US007490307B2

United States Patent
Fomaciari et al.

(10) Patent No.: US 7,490,307 B2
(45) Date of Patent: Feb. 10, 2009

(54) AUTOMATIC GENERATING OF TIMING CONSTRAINTS FOR THE VALIDATION/SIGNOFF OF TEST STRUCTURES

(75) Inventors: Giuseppe Fomaciari, Vimercate (IT); Fabio Mazza, Milan (IT); Cam Luong Lu, Milpitas, CA (US); William Shen, San Jose, CA (US)

(73) Assignee: LSI Corporation, Milpitas, CA (US)

( * ) Notice: Subject to any disclaimer, the term of this patent is extended or adjusted under 35 U.S.C. 154(b) by 77 days.

(21) Appl. No.: 11/478,044

(22) Filed: Jun. 29, 2006

(65) Prior Publication Data

US 2008/0005710 A1  Jan. 3, 2008

(51) Int. Cl.
*G06F 9/45* (2006.01)
*G06F 17/50* (2006.01)
(52) U.S. Cl. .................................. 716/6; 716/4; 716/5
(58) Field of Classification Search ................. 716/4–6, 716/16, 18; 714/726
See application file for complete search history.

(56) References Cited

U.S. PATENT DOCUMENTS

| 6,106,568 A * | 8/2000 | Beausang et al. ............. 716/18 |
| 2003/0093729 A1 * | 5/2003 | Suzuki et al. ................ 714/724 |
| 2003/0145286 A1 * | 7/2003 | Pajak et al. ..................... 716/1 |
| 2003/0145297 A1 * | 7/2003 | Cote et al. ...................... 716/6 |
| 2003/0149949 A1 * | 8/2003 | Price et al. ...................... 716/4 |
| 2004/0015798 A1 * | 1/2004 | Davidson et al. ............... 716/5 |
| 2004/0210806 A1 | 10/2004 | Goyal .......................... 714/724 |
| 2005/0273673 A1 * | 12/2005 | Gassoway ..................... 714/45 |

OTHER PUBLICATIONS

"Primetime: User Guide: Fundamentals" by Synopsys @ Oct. 1999.*

* cited by examiner

*Primary Examiner*—Paul Dinh
*Assistant Examiner*—Nha T Nguyen
(74) *Attorney, Agent, or Firm*—Christopher P. Maiorana, PC

(57) ABSTRACT

An apparatus comprising a database, an input module and a software tool. The database may be configured to generate one or more database files representing a design of an integrated circuit (IC). The input module may be configured to generate one or more test structures to test predetermined portions of the design of an IC. The software tool may be configured to automatically generate test scripts to verify timing constraints of the one or more test structures.

20 Claims, 6 Drawing Sheets

AUTOMATIC GENERATING OF TIMING CONSTRAINTS FOR THE VALIDATION/SIGNOFF OF TEST STRUCTURES

FIELD OF THE INVENTION

The present invention relates to electronic design automation (EDA) generally and, more particularly, to a automatic generation of timing constraints for the validation/signoff of test structures.

BACKGROUND OF THE INVENTION

With IC designs using conventional technologies, test structures are added into a functional IC design to improve yields. Several test structures, like the scan chain, the memory built-in self test (BIST)/built-in self repair (BISR) and Joint Test Access Group (JTAG) are simultaneously adopted to improve such yields. Such test structures are run at high frequencies in order to (i) minimize test time and (ii) accurately reveal manufacturing defects.

With the increasing complexity of designs and multi-million gate technology, verifying test structures based on simulation uses a more significant amount of time. The effort in many designs is becoming unmanageable. Recent test methodologies have been greatly enriched to provide more solutions in order to increase yields. Such test methodologies assure silicon quality for customer applications. Static Timing Analysis (STA) has become an effective solution to verify the correct timing implementation of all different test structures adopted. Timing analysis is needed at several stages in the implementation flow to identify design delays. STA evaluates the effects of logic delays or timing constraints. Prior to STA, correct implementation of test structures was verified by simulation.

However, with the increasing complexity of IC designs, performing simulation is not efficient. Simulation needs long CPU times (matter of days) and the debugging is not easy to perform. Such long CPU runs are difficult to manage for the typical engineer since the long CPU runs often lead to a significant increase in Turn Around Time. Static timing analysis is more efficient than performing simulation since a typical verification can take hours (in place of days) and the debugging of timing issues is more straightforward. STA is also more accurate in very deep submicron technologies since important delay effects due to cross-talk or on-chip variation are taken into account. Such effects are very difficult to be emulated in the simulation environment. However, STA fails to provide an automatic solution for simplifying (i) timing constraint generation that corresponds to simulation pattern generation, (ii) STA runs and (iii) timing result analysis.

Silicon vendors often need to develop in-house software. Third party electronic design analysis (EDA) test tool providers also develop additional software. The in-house software comprises proprietary tools which account for specialized tasks needed by particular silicon vendors. An application engineer often needs to write STA scripts from scratch based on (i) personal knowledge of test structures and (ii) the skill level in the scripting language and the PrimeTime® commands. The application engineer is often found "reinventing the wheel". Such redundancy runs the risk of creating errors which can lead to very expensive silicon redesign. With conventional approaches, the application engineer needs to be continuously updated on various third party EDA test tools such as tools produced by LogicVision®, Mentor®, and Synopsys®. The usage of such EDA test tools in other tools developed also need to be revisited by the typical design engineer.

Timing driven physical optimization tools (i.e., in-house software and third-party test tool providers) need a unique timing constraint setup. With such a unique timing constraint setup, timing constraints for the logic of both the functional design and test structures need to be included. Memory instances are embedded in functional paths, but the memory instances are reached by the memory BIST test logic. Such a condition will lead to overlapping timing constraints (which produce undesired results) or are completely ignored. With such conditions, the final result is not what is expected. Other iterations are needed to fix timing standards that are needed by the overlapping logic in the functional design and in test structures. In order to include all timing constraints for overlapping logic between functional designs and test structures, the user has to merge timing constraints associated with the functional design and the test structures. Such a complex task makes it necessary for a user to acquire (i) a deep knowledge of the timing needs for various test structures and (ii) an understanding of the limits of physical implementation tools. Conventional approaches fail to (i) provide a correct timing constraint setup (which is a key point for obtaining a good physical implementation) and (ii) take into account that constraint merging is more complex than file concatenation.

It would be desirable to provide a method and/or apparatus for the automatic generation of timing constraints for the validation/signoff of test structures.

SUMMARY OF THE INVENTION

The present invention concerns an apparatus comprising a database, an input module and a software tool. The database may be configured to generate one or more database files representing a design of an integrated circuit (IC). The input module may be configured to generate one or more test structures to test predetermined portions of the design of an IC. The software tool may be configured to automatically generate test scripts to verify timing constraints of the one or more test structures.

The objects, features and advantages of the present invention include providing a method and/or apparatus for the automatic generation of timing constraints for the validation/signoff of test structures that may (i) facilitate the debugging of simulation failures by keeping timing pictures tightly linked to simulation vectors (e.g., vectors generated by Vecgen®), (ii) assist the user in focusing on real design criticisms, (iii) automatically filter trivial and/or non-real real timing violations, (iv) automate the timing constraint definition to drive physical optimization tools, (v) automate the timing constraint merging process between logic that is shared by the functional design and test structures, (vi) provide an optimal trade-off between timing accuracy and simple constraint description to achieve global optimization in a single-shot run, (vii) increase the design flow robustness by standardizing and automatizing timing setup, (viii) allow a reduction in prototype hold issues, (ix) provide constraint completeness and coverage, (x) provide a detailed description and explanation of the applied constraints, (xi) simplify pattern generation, (xii) simplify simulation runs and/or (xiii) simplify timing results analysis (best vs. worst compare).

BRIEF DESCRIPTION OF THE DRAWINGS

These and other objects, features and advantages of the present invention will be apparent from the following detailed description and the appended claims and drawings in which:

DETAILED DESCRIPTION OF THE PREFERRED EMBODIMENTS

Figure 1:
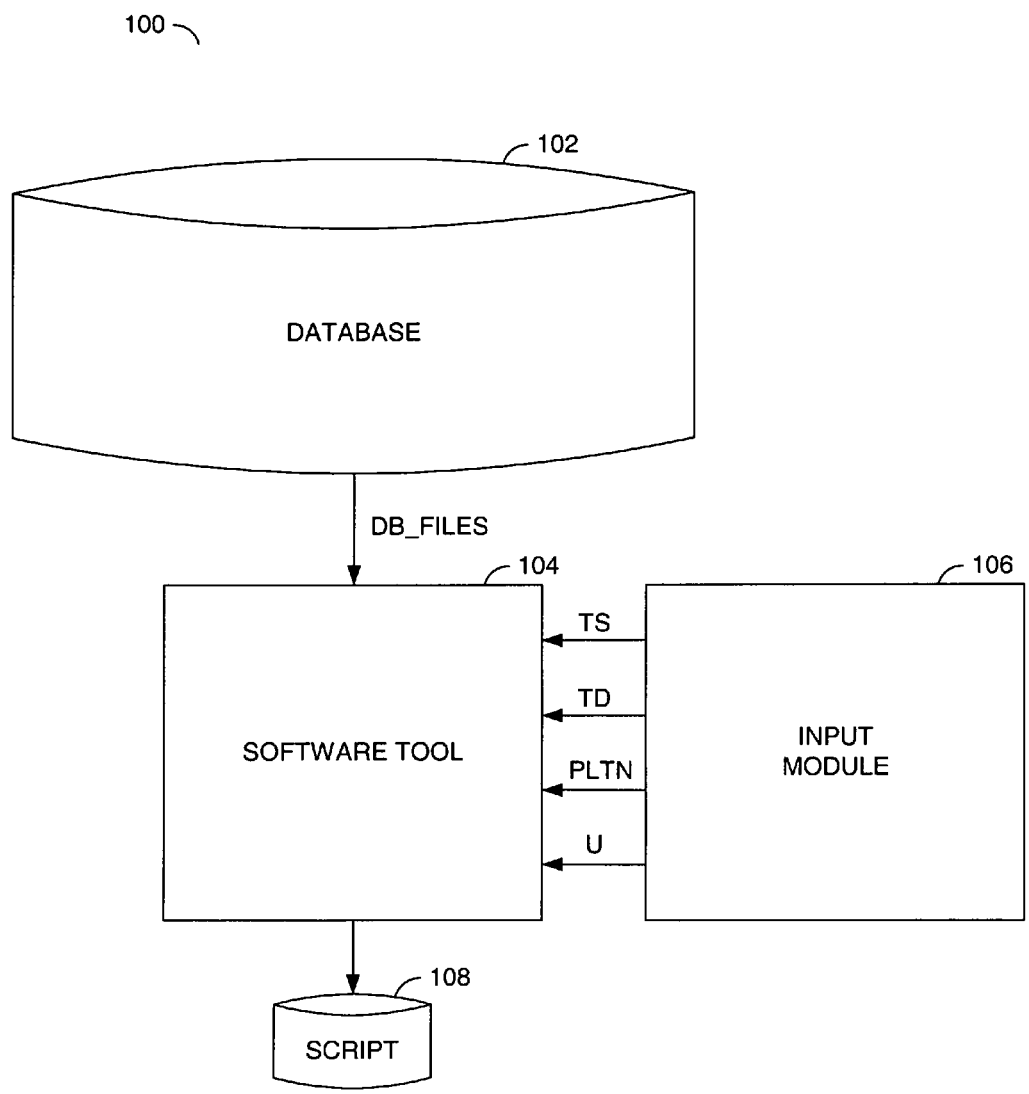
FIG. 1 is a diagram of a preferred embodiment of the present invention.

Referring to FIG. 1, a block diagram of a system 100 is shown in accordance with a preferred embodiment of the present invention. The system 100 generally comprises a database 102, a software tool 104 and an input module 106. The database 102 may present database files (e.g., DB_FILES) to the software tool 104. The input module 106 may present a signal (e.g., TS), a signal (e.g., TD), a signal (e.g., PLTN), and a signal (e.g., U) to the software tool 104. The input module 106 may present information related to test structures over the signal TS. The test structures may be introduced in the design to provide a set of controls for testing predetermined nodes within an ASIC. The test structures may be introduced in the design to guarantee a fault-free IC and to increase the production yield for a customer. Each test structure may include test pins (e.g., both input and output) which may need to be controlled from top level functional pins during manufacturing tests. In general, test structures may be part of the design that is used to test design logic. The use of test structures may reveal manufacturing faults which lower production yields. In one example, test structures may include scan chains, memory BIST logic and JTAG. The input module 106 may present test definition information on the signal TD. The input module 106 may present information related to the Joint Test Access Group (JTAG) Test Access Port (TAP) (e.g., a pre-layout TAP netlist) over the signal PLTN. The input module 106 may present user commands over the signal U. The software tool 104 may automatically generate scripts 108 that may be used to verify timing constraints of the test structures. The software tool 120 may generate scripts to verify timing constraints of the test structures that share logic with the functional design within an IC. The system 100 may be implemented as part of a FlexStream design tool. FlexStream is an integration of best-in-class LSI Logic and third party EDA tools. FlexStream provides a fully integrated design environment for complex ASIC and system-on-a-chip (SOC) design.

Figure 2:
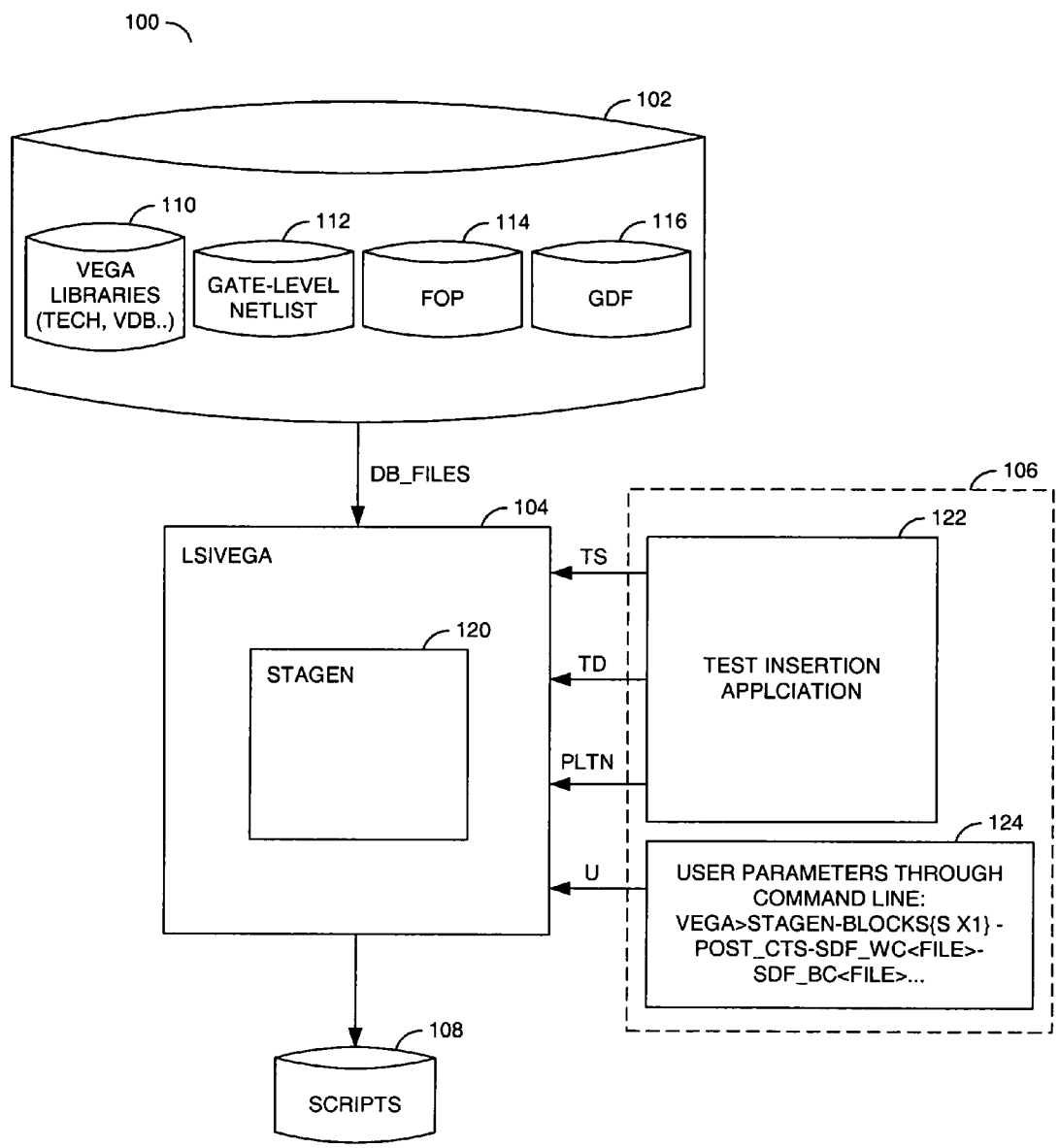
FIG. 2 is a detailed diagram of a preferred embodiment of the present invention.

Referring to FIG. 2, a more detailed diagram of the system 100 is shown. The database 102 may include information related to a library 110, a gate-level netlist 112, a file of pointer (FOP) data 114 and a global data file (GDF) 116. The database 102 may provide information related to a library 110 over the signal DB_FILES. The database 102 may provide the gate-level netlist 112 over the signal DB_FILES. The database 102 may provide FOP data 114 and GDF 116 over the signal DB_FILES. The FOP data 114 and the GDF 116 may be typical products of the LSI-Logic infrastructure and used by several and different applications in Flexstream® and RapidChip® environments. RapidChip® is a structured/platform ASIC produced by, and is a registered trademark of, LSI Logic. The FOP data 114 may allow for various tools to pick from the installation needed elements. For example, the FOP data 114 may allow a user to pick library models, gate level netlists, and configuration files without having to specify the locations for such elements. The FOP data 114 may permit for the system 100 to reference updated elements.

The GDF 116 may be a configuration file which is read by different applications in Flexstream® and RapidChip® environments. The software tool 104 may use the GDF 116 to determine the appropriate level of abstraction to use in STA relative to the Coreware® library (not shown). CoreWare® libraries may comprise high-level pre-packaged silicon IP and are provided by LSI Logic. In general, the database 102 may provide information related to the design of an IC. The software tool 104 may use the information on the signal DB_FILES to generate an application specific integrated circuit (ASIC) or RapidChip®.

The software tool 104 may perform design checking. In one example, the software tool 104 may be a proprietary tool that is orientated to perform design checking. In one example, the software tool 104 may be implemented as an LSI Logic software tool (e.g., LSI VEGA®, a registered trademark of LSI Logic) or other appropriate software tool. The software tool 104 may load the gate-level netlist 112 and link elements in the library 110 to the database 102 to provide for a complete logical description of the design. The FOP files 114 and the GDF 116 may also be used to link the database 102. The system 100 may standardize the insertion and the verification of needed test structures. High-level commands may be invoked in the software tool 104. The high-level commands may transform test structure insertion tasks to other proprietary tools and third party tools. In one example, the high level commands may be used to invoke Primetime, a tool provided by Synopsys, 700 East Middlefield Rd., Mountainview, Calif. 94043. In one example, the high level commands may be used to invoke a Synopsys DC-compiler. In one example, the high level commands may be used to invoke various tools provided by LOGICVISION. The high level commands may also invoke LSI LOGIC tools such as a Flow for Automated Standardized Test (FAST) application. The high level commands may be used by the system 100 to insert test structures in the design. The high-level commands may transform test structure insertion tasks into a sequence of lower level commands that may be propagated to other proprietary tools and third party tools. With such a frame framework, the system 100 may standardize the way that test structures are inserted and verified in the design. The software tool 104 may be invoked by users to obtain timing scripts 108 that may be in-line with standardized test-methodologies.

The system 100 may be based on the LSI VEGA® environment. However, the system 100 may be included in an equivalent or different framework. The system 100 may be enhanced to function without a pre-existent framework (e.g., by adding the capability of loading the netlist autonomously).

The software tool 104 may include a module 120. The module 120 may be implemented as a static timing analysis generation module (or STAGEN module 120). The module 120 may generate STA scripts 108 that may be used in a third party EDA tool. In one example, the scripts 108 may be used in PrimeTime®. The scripts 108 may be generated and implemented for any third party EDA tool provider. The input module 106 generally comprises a test insertion application 122. The test insertion application 122 may be generated from any number of automated standardized tools. In one example, the test insertion application 122 may be implemented as the FAST application developed by LSI Logic. The test insertion application 122 may include a number of test insertion applications (not shown). The test insertion application 122 may use high level commands to insert test structures and additional information related to the test structures over the signal TS. The test insertion application 122 may provide information related to a test definition (or TESTDEF) file over the signal TD. The file TESTDEF may include simulation vectors and relevant information about the test structures. The input module 106 may present a pre-layout Test Access Port (TAP) netlist over the signal PLTN. The input module 106 may provide user parameters 124 over the signal U. The module 120 may use the user parameters to generate Primetime® scripts 108 for the timing verification of inserted test structures.

The test insertion application 122 may include a memory BIST application, a memory BIST insert application, a test generation (or TESTGEN) application and an input/output generation (or IOGEN) application. In one example, the memory BIST application, the memory BIST insert application, the TESTGEN application and the IOGEN application may be generated by the FAST tool 122. The memory BIST application and the memory BIST insert application may insert memory BIST/BISR test structures into (i) memory and (ii) customer logic (or functional logic). The TESTGEN application may insert all full-scan test structures. The IOGEN application may create the top most design level with all test structures (e.g., the test structures inserted by the memory BIST application, the memory BIST insert application and the TESTGEN application may be controlled and observed through primary I/Os and a TAP controller). The IOGEN application may generate the file TESTDEF. The file TESTDEF that is presented over the signal TD may be used by the software tool 104 and a vector generation tool. In one example, the vector generation tool may be a Vecgen® tool which is provided by LSI Logic. The test insertion application 122 may include Vecgen®. Vecgen® may produce all of the simulation test benches needed to activate all test structures inserted into the design. Since the module 120 and Vecgen® uses the same source of information from the file TESTDEF, the simulation environment may be aligned with STA. In one example, the simulation vectors may be generated by Vecgen®.

The module 120 may be implemented as a collection of tool command language (TCL) procedures. The TCL procedures may be part of the software tool 104 (or LSI VEGA®) environment. The module 120 may automatically generate scripts 108. The scripts 108 may be used to verify the correct timing implementation of the (i) test structures and (ii) merged logic between test structures and the functional design. The scripts 108 may be implemented for PrimeTime® runs in a push-button approach.

With such a push-button approach, a user may need to provide a limited set of information to the module 120. The module 120 automatically generates Primetime® scripts that may not need any modifications. The Primetime® scripts may be used to perform STA and only relevant information is normally given back to the user. By providing relevant information back to the user, the user may focus on real issues. In contrast, with conventional methods a user may have to study and understand (i) test structures, (ii) how such test structures are simulated during test vector generation, and (iii) how to translate standards related to test structures that are simulated during test vector generation into timing constraints. With conventional methods, after performing STA, a user needs to analyze generated reports and discard timing issues that are not related to test structures that need to be validated. The present invention may provide relevant information back to the user. With the present invention, a user does not need to be proficient with Primetime®. The module 120 may automatically create an STA setup. Such a setup may be in line with LSI-Logic STA methodology.

The module 120 may also automate the merging of timing constraints of stored logic between the functional design and the test structures which will be used in the software tool 104. The module 120 may automatically generate scripts 108 which take into account merged timing constraints of the stored logic between the functional design and test structures. Such merged timing constraints may be compliant with Synopsis® Design Constraints (SDC). Due to such compliance, the merged timing constraints in the scripts 108 may be used by all physical optimization tools which support the SDC standard format.

In general, with STA, the primary focus is on timing constraints. However, conventional methods fail to provide an STA engine that can handle timing constraints alone. In order to make timing constraints available with conventional methods, the designer needs to prepare an STA setup to properly load the complete design into a dedicated STA tool. The netlist needs to be specified, and the corresponding libraries have to be indicated. Also, timing annotation files and many tool variables need to be declared to correctly interpret additional inputs.

Also, with conventional methods, the analysis of STA results is not simple and users need to spend time and effort querying the STA engine for all potential timing violations. However, with the push-button approach as provided by the system 100, the software tool 104 may focus on timing constraints alone in addition to providing a tool which does not need a user to be proficient with STA. The software tool 104 may prevent a user from having to query the STA engine for all potential timing violations.

The module 120 may need the post-test chip-level netlist 112 loaded and linked in the software tool 104 prior to generating the scripts 108. The module 104 may read and extract information from the file TESTDEF. The file TESTDEF may include simulation vectors for all test structures. The simulation vectors may be generated from any proprietary or third party tool. The file TESTDEF may include relevant information about the test structures. For example, the file TESTDEF may include (i) the names of the ScanIn/Out pins, (ii) instructions to be loaded into the TAP controller instruction-register to setup the design in the desired test mode configuration and (iii) timing information about signoff simulation vectors (e.g., clock cycle and signal waveforms). In general, the timing information related to the simulation vectors may represent a reference timing picture. The module 104 may (i) generate scripts 108 using the reference timing picture and (ii) translate the reference timing picture into an STA environment. The module 120 may rely on the TESTDEF file to ensure proper alignment between simulation and STA environments.

The module 120 may utilize the pre-layout TAP netlist of a JTAG TAP Controller. The pre-layout TAP netlist may be generated by the test insertion application 122 over the signal PLTN. The pre-layout TAP netlist may define pre-layout registers and port associations of the TAP controller. The pre-layout TAP netlist will be discussed in more detail in connection with FIG. 4. The TAP controller may be used to perform JTAG operations as per the IEEE1149 standard. A user dedicated portion in the TAP controller may be extended to configure the design into different test mode functionalities that may be needed.

The different test mode functionalities that may be needed may be obtained by the means of signals presented at the interface of the TAP controller. Such signals may be kept at a static constant value during the whole test run. In response, the STA may have to reflect such behaviour using appropriate timing constraints. The module 120 may use the TAP netlist to identify the internal registers that (i) are directly connected to the TAP interface and (ii) have to be used as anchor points for timing constraints (e.g., the internal register may be the real source of the signals).

The user may input user parameters 124 (or desired parameters) via tool command options to the module 120 in order to execute and produce the scripts 108. The module 120 may be implemented as a command line activated procedure. The command line activated procedure may work in any format defined by the software tool 104. In one example, the command line activated procedure may work in the LSI VEGA® platform as:

LsiVega> StaGen -sdf_wc <filename> -sdf_<filename> -post_cts -blocks {s x . . . }. However, other command line syntaxes may be implemented to meet the design criteria of a particular implementation.

The module 120 may be invoked by users with a command line that may be specialized to obtain different scripts depending on the applied user parameters 124 (or command line switches). For example, a user may input into the module 120:

(i) -blocks <to generate a list of the test-blocks>;
(ii) -post_cts (in case the design already includes clock tree synthesis);
(iii) -sdf_wc <WC_sdf_file> (to specify the name of worst-case delay of the standard delay format (SDF));
(iv) -sdf_bc <BC_sdf_file> (to specify the name of best-case delay SDF); and
(v) -db_root_list {dir1 dir2} (in the case of specific timing models that are not part of the standard installation).

Figure 3:
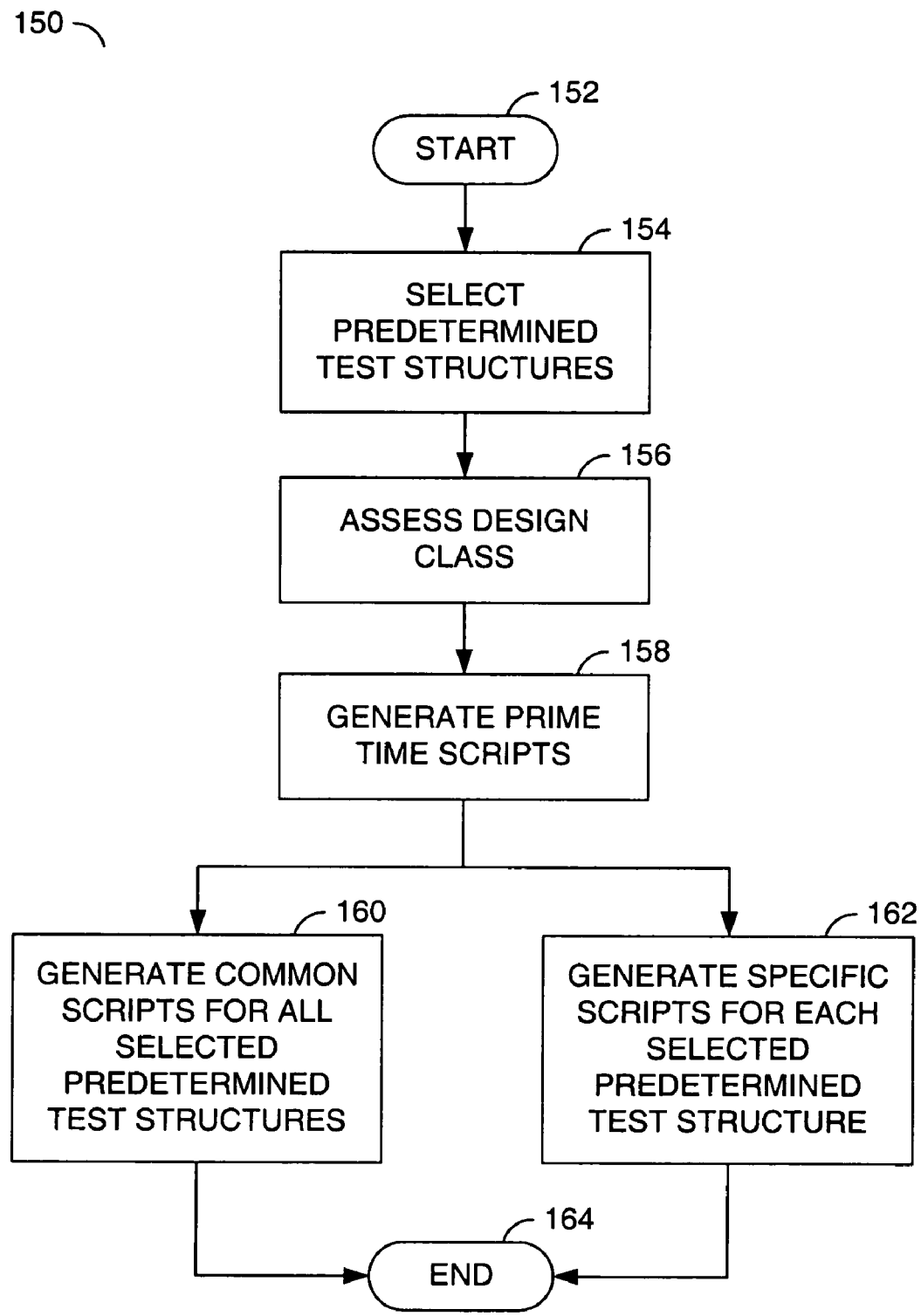
FIG. 3 is a flow diagram for automatically generating scripts.

Referring to FIG. 3, a flow diagram 150 for generating scripts in accordance with the present invention is shown. The flow diagram generally comprises a step (or state) 152, a step (or state) 152, a step (or state) 154, a step (or state) 156, a step (or state) 158, a step (or state) 160, a step (or state) 162 and a step (or state) 164. The state 152 generally comprises a start state. The state 154 may select pre-determined test structures. The module 120 may select or cover critical or predetermined test structures. In contrast, with conventional methods the approach is based on fully post-layout backannotated simulations. Such fully post-layout backannotated simulations are too heavy and time consuming during timing-closure flow. By selecting critical or predetermined test structures, the present invention may decrease the amount of time needed to perform simulations during timing-closure flow. The predetermined test structures may include a scan capture, a scan shift, a memory BIST, JTAG, latch based random access memory (LBRAM) scan capture, a LBRAM scan shift, a BISR related, BISR scan capture, BISR scan shift, BISR fuse final test and wafer sort scan capture, BISR fuse final test and wafer sort scan shift, matrix RAM power on, and/or a matrix RAM BIST.

In general, cells and memory-compilers may be implemented to generate a RAM with a latch based architecture. Using nomenclature as defined by Vecgen®, the state 154 may focus on the following predetermined test structures:

s: scan capture
x1: scan shift
d: memory built-in self test (BIST) data retention
j: JTAG
s1: LBRAM scan capture
x1: LBRAM scan shift
r<i>: BISR related
sb: BISR scan capture
xb: BISR scan shift
sf_sw: BISR fuse final test and wafer sort scan capture
xf_xw: BISR fuse final test and wafer sort scan shift
rrampoweron: matrix RAM power on
rrambist: matrix RAM BIST The state 156 may assess the design class. Depending on the design class (e.g., ASIC, RapidChip®, etc.) and the implemented logic (e.g., not all the designs include LBRAM), only the predetermined test structures for ASIC, RapidChip®, etc., may be generated by the test insertion application 122. The state 158 may 25 automatically generate the scripts 108. The module 120 may automatically generate PrimeTime® scripts 108. The PrimeTime® scripts may be divided in two main parts. In a first part, the state 160 may generate common scripts (or a first set of scripts) for all selected predetermined test structures. In a second part, the state 162 may generate specific scripts (or a second set of scripts) for each selected predetermined test structure. The first set of scripts for all predetermined test structures may include a number of instructions. In one example, the instructions may include (i) performing a PrimeTime® qualified version check, (ii) performing a library load, (iii) generating a memory stamp model compilation (e.g., only for ASIC), (iv) performing a JTAG TAP Controller interface identification, (v) loading and linking of the netlist 112, backannotation loading and/or (vi) setting the appropriate derating path as needed based on-chip-variation effects.

The second set of scripts generated for each specific predetermined test structure may also include a number of instructions. The instructions included in the second set of scripts may include (i) setting case analysis, (ii) establishing timing constraints (e.g., clock definitions, setting of input/output delays, and timing exception (e.g., false paths and multicycle paths)), (iii) performing timing checks that may be focused on relevant points (e.g., report timing, violations of report constraints and report analysis coverage), and (iv) creating comment lines for each specific predetermined test structure.

Figure 4:
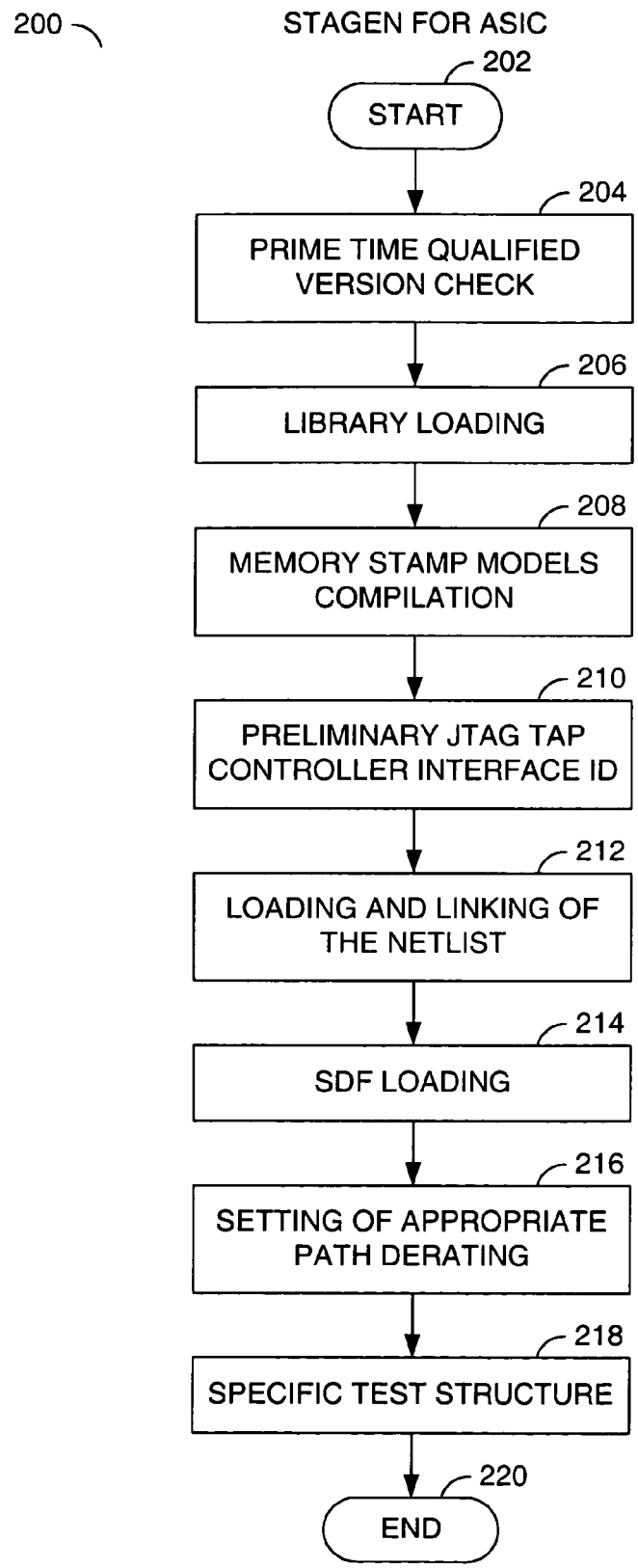
FIG. 4 is a method for executing scripts for an Application Specific Integrated Circuit (ASIC)

Referring to FIG. 4, a method 200 for executing instructions for the first set of scripts for an ASIC design is shown. The method 200 generally comprises a step (or state) 202, a step (or state) 204, a step (or state) 206, a step (or state) 208, a step (or state) 210, a step (or state) 212, a step (or state) 214, a step (or state) 216, a step (or state) 218 and a step (or state) 220. The state 202 may be a start state. The state 204 may perform a PrimeTime® qualified version check.

The state 206 may load the library 110. The library 110 may include a Synopsys® library (not shown) and a CoreWare® library (not shown). For example, based on the chosen FlexStream® release, Synopsys® libraries may be loaded into the PrimeTime® session. CoreWare® libraries may be accessed from the database 102 by specifying the corresponding path at the module 120 through a command-line switch (e.g., -db_root_list). A command-line switch may be a user parameter 124 issued by the user as the user invokes the software tool 104. The command-line switch my allow the user to select a list of test structures to allow the software tool 104 to produce specific scripts 108 for each selected test structure.

The state 208 may load the memory stamp model compilation. Based on the attributes found in the netlist 112 of the database 102. The list of memory cells contained in a design may be extracted and then used to compile corresponding stamp models. To support BISR memories, fuse models related to the BISR memories may be compiled. A fuse model may be a timing model that represents the timing standards for a fuse cell. A fuse cell may be a cell used in the design with the BISR. The fuse cell may include repair information needed to adjust faulty memories. Due to the standardization of the directory structure in FlexStream®, the module 120 may presume to find memory STAMP models (STAMP may be another type of timing modeling abstraction) inside ./memory/ptime directory. The memory models may be compiled on the fly and removed from a disk at the end of the PrimeTime® session. By removing the compiled memory modules after the memory modules are compiled, the system 100 may ensure that the most updated versions of the memory modules are used.

The state 210 may perform a preliminary JTAG TAP controller interface identification. In a low-pin count test methodology, most of the test configurations may come from the output ports of the JTAG TAP controller. In the STA environment, constant values '0' or '1' (or case analysis constraints) may be applied to the test structures.

Since the test structures may be affected by modifications to the netlist 128 (e.g., buffering and/or logic restructuring) during physical implementation, the module 120 may look for real non-modifiable source points of the test structures. The case analysis constraints may be nominally applied to JTAG TAP outputs. Hierarchical port names may not be useful as valid anchor points during physical implementation. The hierarchical port names may not be useful because the hierarchical port names may be modified for signal distribution. For example, in order to buffer a high fanout net, a single port may be replaced with a set of ports. Each port may replicate the same logical information but with a hierarchical port name that may not match the original hierarchical port name. Therefore, the module 120 may (i) look for the real signal source (or registers) of TAP ports and (ii) move STA constraints to the correct places that are preserved during physical optimization steps. Such places may include register output pins or primary ports. By looking for the real signal source of the TAP ports and moving STA constraints to register output pins and/or primary ports, the scripts 108 may be preserved during the complete layout flow. In general, the scripts 108 may be preserved since the registers are not modified in the layout flow. Since the registers are not modified in the layout flow, the pre-layout TAP gate-level netlist (e.g., the JTAG TAP controller pre-layout gate-level netlist which may be available in ./test/fast with a file name 12axxxx_LVISION_JTAP.v for the LSI VEGA tool 104) may be loaded and the register source may be extracted for each output port. The pre-layout TAP netlist may be discarded after the register source is extracted.

The state 212 may load and link the gate-level netlist 112. The module 120 may automatically recognize the list of netlists that may be needed to be loaded in PrimeTime®. In the case of hierarchical design flow, the netlists of HardMacros may need to be included. In the case where missing libraries or missing netlist parts are detected, the PrimeTime® session may automatically abort.

The state 214 may optionally perform SDF loading. In general, SDF is an existing standard for the representation and interpretation of timing data. The timing data as represented in SDF may be available for use at any stage in the EDA process. An SDF file may comprise information related to path delays, timing constraint values, interconnect delays and high level technology parameters. SDF backannotation files may be defined via command line parameters (via user parameters 124) during module 120 invocation.

The state 216 may set appropriate derating path factors. To ensure compliance with flow methodology as needed by the EDA provider, the module 120 may apply proper derating factors based on the technology and the platform that is automatically detected. The module 120 may automatically detect the technology and the platform from the database 102 and input module 106. In one example, the module 120 may apply the appropriate set of derating factors to ensure compliance with the particular flow methodology implemented. In one example, the module 120 may apply the proper derating factors based on the technology (e.g., G12, Gflx®, etc.) and the platform (e.g., ASIC, RapidChip®, etc.). The state 218 may perform testing of a specific predetermined test structure. The testing of a specific predetermined test structure will be discussed in more detail in connection with FIG. 6. The state 220 may end the method 200.

Figure 5:
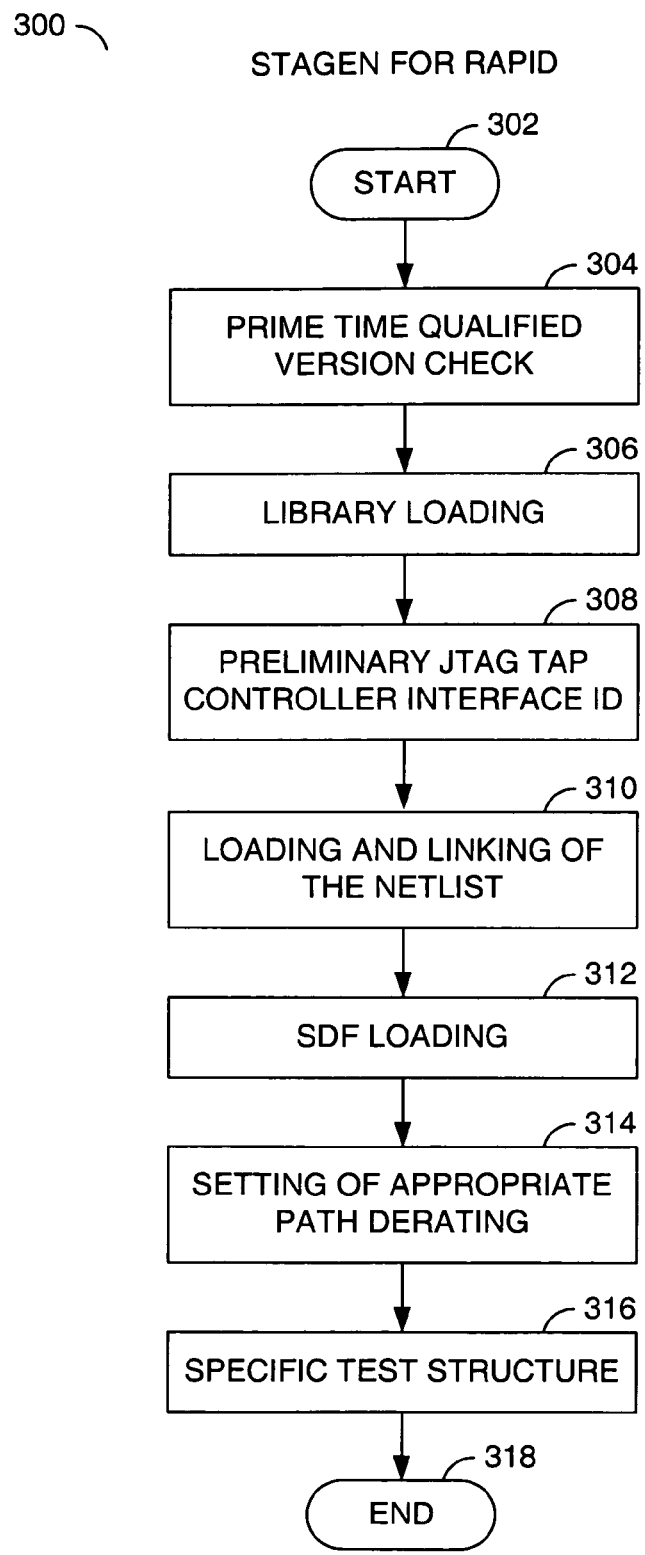
FIG. 5 is a method for executing scripts for a RapidChip®.

Referring to FIG. 5, an example of a method 300 for executing instructions for the first set of scripts for a RapidChip® design is shown. The method 300 generally comprises a state (or step) 302, a state (or step) 304, a state (or step) 306, a state (or step) 308, a state (or step) 310, a state (or step) 312, a state (or step) 314, a state (or step) 316 and a state (or step) 318.

The state 304 may perform a PrimeTime® qualified version check. For example, only particular qualified versions of PrimeTime® may be accepted for STA. The check for qualified versions of PrimeTime® may be inserted as part of the scripts 108. PrimeTime® sessions may be aborted when the wrong version (or a version that is not qualified) is detected. The PrimeTime® qualified version check is part of a common script for all tests structures.

The state 306 may perform library loading. Based on the chosen process technology (G12®, Gflx®, etc.), the chosen RapidWorx® release and the selected Slice®, all of the available Synopsys® libraries in the database 102 may be loaded into the PrimeTime® session. The Synopsys® library may be loaded regardless of the cell usage in the current design. For "firm" or "diffused" CoreWare® libraries, the module 120 may automatically search for needed extracted timing models (ETM) on the basis of the information loaded in database 102. A memory stamp model compilation may not be needed for RapidChip® because such a step may be performed at the library level. The state 308 may perform preliminary JTAG TAP Controller interface identification. The state 308 is similar to the state 210 as described in connection with FIG. 4.

The state 310 may load and link the netlist 112. The module 120 may automatically recognize the list of the netlists 112 to be loaded in PrimeTime®. The module 120 may analyze the netlist 112 that is loaded in the software tool 104. Verilog descriptions of CoreWare® HardMacros may be dropped to avoid conflicts with corresponding ETMs.

The state 312 may optimally perform SDF loading. The state 312 is similar to the state 214 as described in connection with FIG. 4. The state 314 may set an appropriate derating path. The state 314 is similar to the state 216 as described in connection with FIG. 4.

Figure 6:
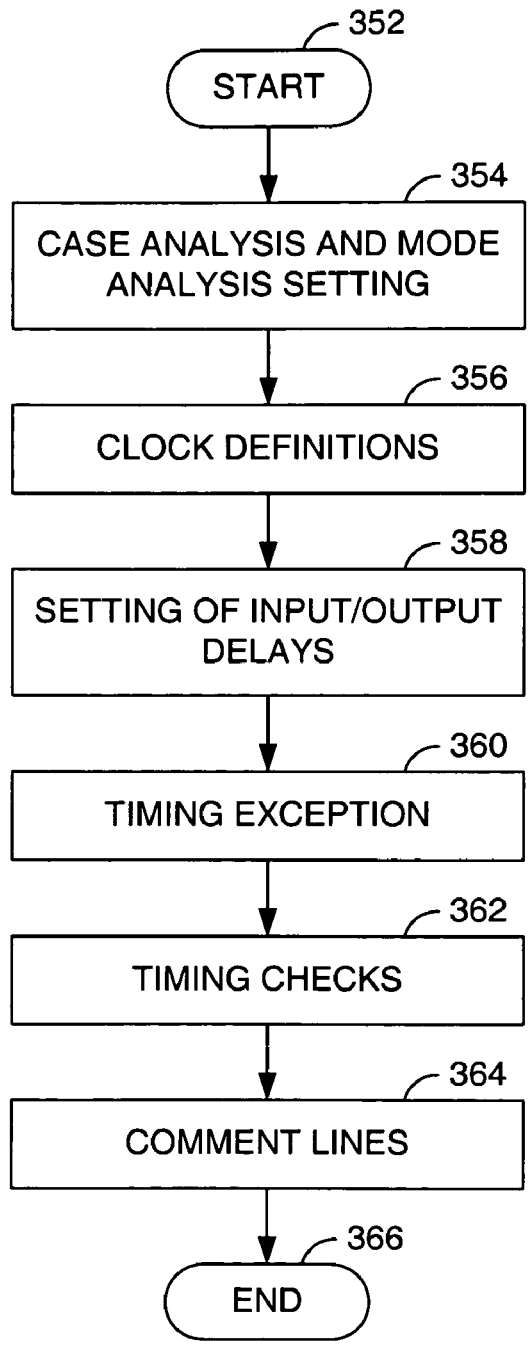
FIG. 6 is a method for executing scripts related to the testing of a specific test block for an ASIC and RapidChip®.

Referring to FIG. 6, a method 350 for executing instructions for the second set of scripts for specific predetermined test structures is shown. The method 350 may be applied to ASIC and RapidChip® platforms. The method 350 generally comprises a step (or state) 352, a step (or state) 354, a step (or state) 356, a step (or state) 358, a step (or state) 360, a step (or state) 362, a step (or state) 364, and a step (or state) 366. The state 352 may be a start state. The state 354 may perform case analysis and mode analysis setting. In the state 354, the module 120 may apply the proper set of case analysis to extract information from different sources. In one example, the module 120 may extract information from the file TESTDEF. For example, the module 120 may extract JTAG instructions from the TESTDEF file. The JTAG instructions may be (i) applied to a JTAG TAP Instruction Register and (ii) propagated to JTAG TAP output ports. The module 120 may also extract primary input constants and other JTAG TAP output signals (e.g., one or more signals LSI.xxxx that may be applied accordingly based on step 208 as shown in connection with FIG. 4) from the file TESTDEF. The signals LSI.XXXX may be dedicated test signals sent from the user dedicated part of the TAP controller module. The signals LSI.XXXX may configure the design in a specific test mode.

In one example, the signals LSI.XXXX may include (i) a signal (e.g., LSI_SCAN_MODE), (ii) a signal (e.g., LSI_BISR_MODE), and (iii) a signal (e.g., LSI_LBRAM_SCAN_MODE). The signal LSI_SCAN_MODE may allow the controllability of register clock pins from the primary port. The signal LSI_SCAN_MODE may be switched on during BISR related patterns. The signal LSI_LBRAM_SCAN_MODE may be switched on during the LBRAM memory test.

In one example, the module 120 may apply hard-coded rules (or timing constraints) based on the knowledge and design experience of the user in the design for testability field. In such a case, case analysis constraints may be hard-coded into the module 120. In one example, the module 120 may extract information from other primary input constants and other internal modes.

The state 356 may set clock definitions. In the test insertion application 122, all of the clocks of the test structures may be activated by primary ports. Characteristics of the test structure clocks may be defined in the file TESTDEF (e.g., period and waveforms). Virtual clocks may be used to properly constrain I/Os that are dedicated to test primary ports or I/Os shared with customer functional application primary ports. All of the virtual clocks may be based on clock cycles extracted from the file TESTDEF. The module 120 may apply a predetermined amount of uncertainty time on all clocks and virtual clocks to emulate tester skew. In one example, the module 120 may apply 0.6 ns of uncertainty time on all of the clocks.

The state 358 may set input/output delays. The timing characteristics for primary inputs related to test structures may be extracted from the file TESTDEF. The timing characteristics extracted from the file TESTDEF may be translated into any number of PrimeTime® commands. The timing of the primary outputs related to test structures may reflect strobe design guidelines. In general, primary inputs and outputs may be shared between test structures (or test logic) and functional logic. The test insertion application may be implemented such that a minimum number of primary inputs and outputs are dedicated for test structures to prevent increased cost in a chip. The module 120 may assume that the primary outputs has to be stable within a predetermined stability time (e.g., 2.4 ns) before the end of the cycle. The input and output delay information related to the test structures may be translated into a PrimeTime® command.

The state 360 may determine timing exceptions (e.g., false paths and multicycle paths) for the test structures. The timing exceptions may be extracted from simulation results based on internal testcases. In one example, the test cases may be based partially from documentation provided by LSI Logic and other third party EDA providers. The timing exceptions may be hard-coded in the module 120. All timing exceptions may be applied to stable anchor points (e.g., clocks, I/Os and registers). The application of timing constraints to stable anchor points (e.g., stable anchor points that may not be modified during the physical optimization flow) may guarantee that such timing constraints remain valid throughout the complete timing closure flow.

The state 362 may perform timing checks. The timing checks may be block oriented so that relevant points of a test structure under examination may be investigated. By implementing a block orientated timing check on relevant points of the test structure, the system 100 may facilitate a reduction in the number of reports that may need to be investigated by a user. The user may have the flexibility to obtain verbose and/or compact reports. The module 120 may provide that (i) all investigated points may be reported within minimum and maximum delay times and (ii) the path with a timing slack that is beyond a predetermined threshold may be reported. All the relevant timing violations may be summarized in a specific report. The report may indicate the endpoint and the timing slack value. The report may also omit path details.

The module 120 may provide an analysis coverage report. The analysis coverage report may be varied (e.g., using different options) to notify a user whether all of the relevant points in a specific test structure are properly constrained. The module 120 may post-process original PrimeTime® reports to allow the user to focus on real issues. By post processing original PrimeTime® reports, the user may avoid wasting time in analyzing trivial messages.

The state 364 may provide comment lines. The module 120 may write pictures that describe architectural subparts. The module 120 may provide waveform drawings and textual information that describes the test circuitry (or test structures). The waveform drawings and textual information may assist the user in understanding test timing constraints.

The present invention may automatically generate STA scripts 108 that may be used in a PrimeTime® environment. The scripts 108 may verify main test structures. The main test structures may be generated by the test insertion application 122. The module 120 may facilitate the debugging of simulation failures by keeping timing pictures tightly linked to simulation vectors. The simulation vectors may be generated by Vecgen® of the test insertion application 122. The present invention may assist the user in focusing only on real criticisms. The present invention may automatically filter trivial and/or non real timing violations. In current very deep submicron technologies, STA methodology may be considered a key and crucial point in signoff flow. With STA methodology, diligent attention may be needed to various factors and parameters that significantly affect timing results and final silicon implementation.

The present invention may increase the standardization of design flow robustness and the automatization of timing setup for a number of technologies. In one example, the present invention may increase design flow robustness and automate the timing setup for G90®, Gflx, G12, and other process technologies produced on both ASIC and RapidChip. Such an increase in design flow may be achieved by following a particular STA methodology. The present invention along with any automated flow for insertion tool may allow for great reduction in proto-hold issues.

The module 120 may be implemented as a command line tool. The module 120 may be implemented into any software tool 104 that performs gate-level netlist design rule checking. In one example, the module 120 may be implemented as part of the LSI VEGA® tool. The module 120 may specify a limited set of switches to generate STA scripts. The limited set of switches may be defined as providing a user with only a few parameters in order to invoke the module 120. An example of a typical invocation for the module 120 as used within the LSI VEGA® environment may include the following:

Stagen -blocks {s x1} -post_cts -sdf_wc <WcSDF> -sdf_bc <BcSDF>

The STA scripts 108 may be used to verify the following test structures:

(i) Scan chains (e.g., capture and load/unload operations),
(ii) Memory BIST,
(iii) Memory BISR,
(iv) Matrix RAM,
(v) Latch based memories (e.g., capture and load/unload operations), and
(vi) Joint Test Action Group (JTAG).

The types of test structures that may be verified by the scripts 108 may be varied to meet the design criteria of a particular implementation. The test insertion application 122 has allowed for the standardization of a number of test structures that may be needed for current methodology. By relying on such a standardization, the module 120 may automate timing constraint generation for test structures.

The present invention may provide for automatic script generation. The automatic script generation may (i) minimize turn around time, (ii) prevent engineers from reinventing the wheel, (iii) standardize the complete STA flow and (iv) provide for constraint completeness and coverage. Such constraint completeness and coverage may increase design robustness and minimize silicon failure risks. Increased design robustness and the minimization of silicon failure risks may be accomplished by providing (i) a continuous constraint review on the basis of the evolution of the test insertion application 122, (ii) a strong link between test methodologies and test automation groups, (iii) testcase collection and (iv) the continuous verification of alignment between STA setup and corresponding simulations.

The present invention may provide for a detailed description and explanation of applied constraints. By providing for a detailed description and explanation of applied constraints, a user may understand the reasons for specific timing constraints. The present invention may insert timing waveforms, schematic diagrams and verbose descriptions directly into the scripts 108.

The present invention may provide for the filtering of false timing violations. By filtering false timing violations, the user may focus on real timing problems and criticisms. The present invention may allow for the timing validation of various test structures by automatically generating PrimeTime® scripts. The present invention may minimize user intervention by relying on the deep standardization of test structures offered by the test insertion application 122.

The present invention may produce the basic infrastructure in addressing STA automation of functional parts. The present invention may address STA automation by (i) including functional constraints (e.g., constraints as provided by customers) in a common structure with other scripts and (ii) applying the same standardized methodology and the same type of checks already defined for test scripts.

The present invention may within a single setup, create a merged view which may include relevant test structures implemented in a design (e.g., scan-chain, memory-BIST/BISR, JTAG, LBRAM macro test, and matrix-RAM). By creating such a merged view, the system 100 may assure a correct implementation of shared logic between all test structures and the functional design in a one-step approach. The present invention may produce merged constraints in a Synopsis® Design Constraints (SDC) file format. The SDC file format generated by the present invention may be used by proprietary (e.g., LSI Logic) and other third-party physical implementation tools.

The function performed by the flow diagram of FIGS. 3-6 may be implemented using a conventional general purpose digital computer programmed according to the teachings of the present specification, as will be apparent to those skilled in the relevant art(s). Appropriate software coding can readily be prepared by skilled programmers based on the teachings of the present disclosure, as will also be apparent to those skilled in the relevant art(s).

The present invention may also be implemented by the preparation of ASICs, FPGAs, or by interconnecting an appropriate network of conventional component circuits, as is described herein, modifications of which will be readily apparent to those skilled in the art(s).

The present invention thus may also include a computer product which may be a storage medium including instructions which can be used to program a computer to perform a process in accordance with the present invention. The storage medium can include, but is not limited to, any type of disk including floppy disk, optical disk, CD-ROM, magneto-optical disks, ROMs, RAMs, EPROMs, EEPROMs, Flash memory, magnetic or optical cards, or any type of media suitable for storing electronic instructions.

While the invention has been particularly shown and described with reference to the preferred embodiments thereof, it will be understood by those skilled in the art that various changes in form and details may be made without departing from the scope of the invention.

The invention claimed is:

1. An apparatus comprising:
a database configured to generate one or more database files representing a design of an integrated circuit (IC);
an input module comprising a test insertion application configured to generate one or more test structures and simulation vectors to test predetermined portions of said design of an IC; and
a software tool configured to automatically (i) generate test scripts to setup and control a static timing analysis (STA) tool to verify timing constraints of said one or more test structures and (ii) report only those timing issues relevant to the one or more test structures by filtering false timing violations reported by the STA tool, wherein said software tool (A) reads and extracts information about the one or more test structures from the test insertion application tightly linked to the generation of simulation vectors for the one or more test structures and utilizes a pre-layout netlist of a test access port (TAP) controller to define pre-layout registers and port associations of the test access port and (B) is further configured to automatically (i) merge timing constraints of overlapping logic between said tests structures and a functional portion of said IC and (II) generate said scripts to verify timing constraints of said overlapping logic between said test structures and said functional portion of said IC.

2. The apparatus according to claim 1, wherein said input module generates said test structures via high level commands that invoke third party tools.

3. The apparatus according to claim 1, wherein said software tool determines a design class for said design of an IC.

4. The apparatus according to claim 3, wherein said test scripts are divided into two parts comprising (i) a first set of test scripts which are common to all selected test structures and (ii) a second set of test scripts which are specific to each selected test structure.

5. The apparatus according to claim 4, wherein said first set of test scripts executes instructions related to an application specific integrated circuit (ASIC) design class.

6. The apparatus according to claim 4, wherein said first set of test scripts executes instructions related to a structured/platform ASIC design class.

7. The apparatus according to claim 4, wherein said second set of scripts executes instructions specific to each of said selected test structures.

8. The apparatus according to claim 1, wherein said input module further comprises a test insertion application configured to generate and insert said one or more test structures into said design.

9. The apparatus according to claim 1, wherein said software tool is further configured to automatically analyze one or more reports generated by said STA tool.

10. The apparatus according to claim 1, wherein said software tool generates said test scripts based upon one or more types of information selected from the group consisting of a post-test chip-level netlist, names of ScanIn/Out pins, instructions to be loaded into a test access port (TAP) controller instruction-register to setup the design in a desired test mode configuration and timing information about signoff simulation vectors.

11. The apparatus according to claim 10, wherein said timing information about signoff simulation vectors comprises one or more of clock tree synthesis information, worst case delay information and best case delay information.

12. The apparatus according to claim 1, wherein said software tool is further configured to (i) determine real signal sources of TAP ports and (ii) move STA constraints to locations in said design that are preserved during a layout flow.

13. An apparatus comprising:
means for generating one or more database files representing a design of an integrated circuit (IC);
means for generating one or more test structures and simulation vectors to test predetermined portions of said design of an IC; and
means for automatically (i) generating test scripts to setup and control a static timing analysis (STA) tool to verify timing constraints of said one or more test structures and (ii) report only those timing issues that are relevant to the one or more test structures by filtering false timing violations reported by the STA tool; means for reading and extracting information about the one or more test structures from test insertion application tightly linked to the generation of simulation vectors for the one or more test structures and utilizes a pre-layout netlist of a test access Port (TAP) controller to define pre-layout registers and port associations of the test access port and means for automatically (i) merging timing constraints of overlapping logic between said test structures and a functional portion of said IC and (ii) generating said test scripts to verify timing constraints of said overlapping between said test structures and functional portion of said IC.

14. A method for verifying timing constraints of test structures in an electronic design automation (EDA) test tool, comprising the steps of:
(A) generating one or more database files representing a design of an integrated circuit (IC);
(B) generating said test structures and simulation vectors to test predetermined portions of said design of an IC; and
(C) automatically (i) generating test scripts to setup and control a static timing analysis (STA) tool to verify timing constraints of said test structures and (ii) reporting only those timing issues relevant to said test structures by filtering false timing violations reported by the STA tool, wherein information about the one or more test structures tightly linked to the generation of the simulation vectors for the test structures is read and extracted from a test insertion application and a pre-layout netlist of a test access port (TAP) controller is utilized to define pre-layout registers and port associations of the test access port and (D) automatically (i) merging timing constraintsof overlapping logic between said test structures and a functional portion of said IC and (ii) generating said test scripts to verify timing.

15. The method according to claim 14 wherein step (C) further comprises the step of:
selecting test structures via user commands.

16. The method according to claim 15, further comprising the step of:
assessing a design class for said integrated circuit design.

17. The method according to claim 15, further comprising the step of: dividing said test scripts into (i) a first set of test scripts which are common to all selected test structures and (ii) a second set of test scripts which are specific to each of said selected test structures.

18. The method according to claim 17, further comprising the step of:
executing instructions in said first set of test scripts related to an application specific integrated circuit (ASIC) design class.

19. The method according to claim 17, further comprising the step of:
executing instructions in said first set of test scripts related to a structured/platform ASIC design class.

20. The method according to claim 17, further comprising the step of: executing instructions in said second set of scripts specific to each of said selected test structures.

* * * * *